3,036,913

IMPROVED ADHESIVE COMPOSITION COMPRISING A POLYESTER AND A THERMAL INITIATOR FOR BINDING A PHOTOPOLYMERIZABLE LAYER TO A SUPPORT

Marion Burg, Metuchen, N.J., assignor to E. I. du Pont de Nemours and Company, Wilmington, Del., a corporation of Delaware No Drawing. Filed July 25, 1958, Ser. No. 750,868
9 Claims. (Cl. 96—67)

This invention relates to improved addition polymerization elements utilizing novel adhesive compositions to bond together an addition-photopolymerizable layer and a base support, e.g., sheet or plate.

Photopolymerizable elements useful for making printing reliefs are described in Plambeck U.S. Patent 2,791,-504. These elements have a photopolymerizable layer comprising a polymeric binder, an addition polymerization initiator activatable by actinic light, and an addition polymerizable ethylenically unsaturated compound capable of forming a high polymer by photo-initiated addition polymerization in the presence of such an initiator on a suitable support. These elements usually contain antihalation material which is generally in a layer or stratum beneath the relief-forming portion of the photopolymerizable layer.

Usually these photopolymerizable elements of the type described in the Plambeck patent have an anchor layer between the photopolymerizable layer and the base sheet or plate. This provides for the adherence of the layer to the base which generally is made of metal.

It is important that the anchor layer be capable of binding the photopolymerizable layer to the base support with great strength and yet not interfere in any manner with the photopolymerization and processing of the element during its preferred usage in the preparation of a relief image printing plate.

It has been found necessary to protect the adhesive composition of the anchor layer from solvents or other harmful substances that would weaken its adhesive properties. This is particularly required because the multilayer element, after polymerization by exposure of the polymerizable layer to actinic light through, for example, a negative to form a hardened relief image, is washed or sprayed with a solvent to remove all the unpolymerized polymerizable material. Especially in unexposed areas of the relief element, the solvent is able to attack the adhesive layer, thereby weakening the bond and permitting undesired separation between the relief layer and the base support. This has been found to be a deficiency in prior art photopolymerizable elements and printing plates. Even where adhesive compositions were used that were found to give good adhesion to both polymerizable materials and base supports, the adhesives could not effectively bind the polymerized image to the base supports after the elements had been washed and sprayed with solvent because, as stated above, the solvent attacks the adhesive.

Another deficiency of prior art anchor layers is that some of the relief image characters of the photopolymerized printing elements can be easily pushed over and separated from the base support during normal press operations. It has been found that this is due to the small area of some characters in contact with the anchor layer and to the type of anchor layer utilized.

It is therefore an object of the present invention to provide improved photopolymerizable elements having outstanding adhesion characteristics between layers. Another object is to provide such elements that overcome the above-described short comings of the prior art. A particular object is to provide a new photopolymerizable element having an anchor layer composed of an improved adhesive composition. Still further objects will be apparent from the following description.

The improved photopolymerizable elements of this invention comprise (I) a support; (II) a solid photopolymerizable layer comprising a cellulose carboxylic acid ester, an ethylenically unsaturated monomer capable of forming a high polymer by photoinitiated photopolymerization, and an addition polymerization initiator activatable by actinic light and thermally inactive at 185° C. and below; and (III), between (I) and (II) and in surface contact with (II), an anchor layer of an adhesive composition comprising (A) at least 66.5 parts of a linear polymeric composition selected from the following three polymeric compositions; (1) a polyester corresponding to the esterification product of (*a*) hexahydroterephthalic acid and (*b*) a glycol (a saturated aliphatic dihydric alcohol) having from 2 to 10 carbon atoms and 0 to 4 oxygen atoms in addition to the hydroxyl groups; (2) at least one copolyester corresponding to the esterification product of (*a*) at least one saturated aliphatic dicarboxylic acid represented by the formula $$HOOC—(CH_2)_n—COOH$$

where $n$ is an integer from 4 to 8 both inclusive, the total of the aliphatic dicarboxylic acids being in an amount of 50 mole percent of the copolyester; (*b*) at least one aromatic dicarboxylic acid from the group consisting of terephthalic acid and isophthalic acid, the total of the aromatic dicarboxylic acids being in an amount of 50 mole percent of the copolyester; and (*c*) a glycol (a saturated aliphatic dihydric alcohol) having from 2 to 10 carbon atoms and 0 to 4 oxygen atoms in addition to the hydroxyl groups; and (3) a copolyester corresponding to the esterification product of (*a*) hexahydroterephthalic acid in an amount up to 100 mole percent, and preferably within the range from 20 to 80 mole percent, of the copolyester; (*b*) a saturated aliphatic dicarboxylic acid represented by the formula $HOOC—(CH_2)_n—COOH$ where $n$ is an integer from 4 to 8 both inclusive, in an amount up to 50 mole percent, and preferably within the range from 10 to 40 mole percent, of the copolyester; (*c*) an aromatic dicarboxylic acid from the group consisting of terephthalic acid and isophthalic acid, in an amount up to 50 mole percent, and preferably within the range from 10 to 40 mole percent, of the copolyester; and (*d*) a glycol (a saturated aliphatic dihydric alcohol) having from 2 to 10 carbon atoms and 0 to 4 oxygen atoms in addition to the hydroxyl groups; and (B) from 0.5 to 10 parts by weight of a thermally sensitive addition polymerization initiator thermally active below 180° C. and substantially thermally inactive below about 60° C.

When the anchor layer adhesive composition (III) is the copolyester (3) above, the copolyester contains preferably equal proportions of components (*b*) and (*c*). Specifically, a highly preferred copolyester, found to provide markedly outstanding adhesion characteristics in the elements of this invention, comprises the reaction product of ethylene glycol and dimethyl hexahydroterephthalate, dimethyl sebacate and dimethyl terephthalate, the latter three reactants being used in a molar ratio of 8:1:1 respectively.

It can be seen from the above that the two essential ingredients of the adhesive compositions are (A) the linear polyester or copolyester and (B) the thermally sensitive addition polymerization initiator, as described above. The use of such polyester or copolyester is believed to be completely new in the art of photopolymerizable elements, with significant advantages set forth below. The manner in which the combination of ingredients acts to overcome the above-described deficiencies of the prior art will be explained hereinafter.

In a preferred adhesive composition, in addition to the two essential ingredients described above, the composition additionally contains up to 33 parts by weight of an ethylenically unsaturated addition polymerizable compound containing a polymerization inhibitor.

A specific preferred adhesive composition contains (1) about 75 parts by weight of the copolyester corresponding to the esterification product of ethylene glycol and dimethyl hexahydroterephthalate, dimethyl sebacate and dimethyl terephthalate, the latter three reactants being used in a molar ratio of 8:1:1 respectively, (2) about 2.4 parts by weight of benzoyl peroxide as the thermally sensitive addition polymerization initiator, and (3) about 22.5 parts by weight of triethylene glycol diacrylate as the ethylenically unsaturated addition polymerizable compound, containing about 0.1 part by weight of p-methoxyphenol as the polymerization inhibitor. These components are conveniently admixed in a solvent solution, such as in methyl ethyl ketone, preferably in an amount of about 311 parts by weight.

The polyester or copolyester that forms one essential component of the adhesive composition can be prepared in accordance with known procedures and techniques, for example, as disclosed in Whinfield et al. U.S. 2,465,319, Snyder U.S. 2,623,031 and Snyder U.S. 2,623,033, by the alcoholysis with the suitable glycol of the dialkyl (for example, dimethyl) ester or esters of the acid component or components. The reaction is preferably carried out in the presence of one or more esterification catalysts. Suitable catalysts are known in the art. A preferred combination of catalysts includes calcium acetate and antimony trioxide.

The dialkyl hexahydroterephthalate can be conveniently prepared by the hydrogenation of dialkyl terephthalate over Raney nickel.

As disclosed in the Whinfield et al. and Snyder patents referred to above, with reference to the preferred copolyester, the alcoholysis reaction comprises heating the alkyl esters of the respective acids in the liquid state at atmospheric pressure and at a temperature of from 155° C. to 240° C. together with an excess of the dihydric alcohol reactant, and preferably from 1.5 to 3.0 moles of the dihydric alcohol reactant per mole of dialkyl ester, in the presence of the selected catalyst or combination of catalysts. Methanol is liberated during the ester interchange reaction. After the evolution of the methanol is complete, heating of the resulting monomeric bisdihydric alcohol esters is continued in a melt polymerization process under reduced pressure, such as from 0.5 millimeter to 2 millimeters of mercury at an increased temperature, such as from about 240° to about 280° C., with agitation until the resulting copolyester has the desired viscosity.

The adhesive compositions of this invention can be prepared by simple admixture, for example, in a suitable solvent, of the desired amounts of the polyester or copolyester or mixtures of copolyesters prepared as described above and the thermally sensitive addition polymerization initiator, and, if desired, other ingredients, such as the ethylenically unsaturated addition polymerizable compound containing a polymerization inhibitor, an antihalation material, e.g., dye or pigment, etc.

As stated above, the new photopolymerizable elements utilizing the adhesive compositions comprise (I) a support which may be a sheet or plate, planar or curved; (III) an anchor layer of the adhesive composition; and (II) a photopolymerizable layer, preferably having a thickness of 3 to 250 mils, and more preferably 10 to 80 mils, and comprising (*a*) a cellulose carboxylic acid ester, (*b*) an ethylenically unsaturated monomer capable of forming a high polymer by photoinitiated addition polymerization, and (*c*) an addition polymerization initiator activatable by actinic light and thermally inactive at 185° C. and below.

It is necessary that the photopolymerizable layer (II) be in contact with the anchor layer (III) for reasons explained below, but it is not essential that the anchor layer (III) be in surface contact with the support (I). For example, the sheet support can bear thereon a surface coating or layer of an antihalation material, which can be in a suitable binder, and this coating in turn carry the anchor layer. In an alternative structure, the antihalation material can be admixed in the adhesive composition of the anchor layer (III) itself, with effective results.

In an exemplary procedure, an adhesive composition of the type described above in a suitable solvent, such as methyl ethyl ketone, is used to coat a steel plate. The coating is dried and a sheet of a milled photopolymerizable mixture of cellulose acetate hydrogen succinate, triethylene glycol diacrylate and anthraquinone is press-laminated to the coated layer on the steel sheet after the manner described in U.S. Patent No. 2,791,504, Example XVII. During the press-lamination, the element is placed in a hydraulic press, the platens of which are heated to about 150° C. (or above the sensitivity temperature of the thermal initiator), and pressed for about three minutes at 200 p.s.i. During this pressing operation, the addition polymerization thermal initiator thermally active below 180° C. in the adhesive composition causes that portion of the light-sensitive polymeric photopolymerizable composition in the photopolymerizable layer in contact with the adhesive to insolubilize and harden.

Thus, there is formed at the interface of the adhesive composition anchor layer and the photopolymerizable layer a thin barrier of solvent-resistant polymerized material. The thickness of this barrier layer will be only a small fraction of the total thickness of the photopolymerizable layer and preferably less than about 20 mils, depending on the initial concentration of the thermal initiator, the aging time for the photopolymerizable element, the particular ingredients used, etc. This barrier layer effectively serves to prevent the passage of solvent or other material that might weaken the adhesive bond of the anchor layer between the support and the photopolymerizable layer. This is accomplished without any deleterious effect upon the photopolymerizable layer and the highly sensitive material therein.

The photopolymerizable layer of the element is exposed in a vacuum frame through a process negative to approximately 10 to 50 watt-seconds of actinic radiation per square inch, and the non-image area washed away using an aqueous solution, preferably dilute sodium hydroxide. In the unexposed areas a thin layer (the barrier layer) of polymerized material remains while a thick image layer is present in the exposed areas. Due to the formation of this thin layer of polymerized material, the printing characters are strongly bound to the base support and exhibit exceptional dimensional stability.

The particularly outstanding advantage of the elements of this invention lies in the inter-layer adhesion or bonding of superior strength attained by the use of the polyester or copolyester adhesive described above rather than adhesives used in prior art photopolymerizable elements.

The invention will be further illustrated but is not intended to be limited by the following examples, in addition to the examples appearing above, wherein the parts and percentages stated are by weight unless otherwise indicated.

EXAMPLE 1

An adhesive composition solution was composed of 37% solids in methyl ethyl ketone, the solids consisting of 100 grams of a copolyester prepared from a reaction mixture of an excess of ethylene glycol and dimethyl hexahydroterephthalate, dimethyl sebacate and dimethyl terephthalate in a molar ratio of the latter three reactants of 8:1:1 respectively; 30 grams of an ethylenically unsaturated addition polymerizable compound, triethylene glycol diacrylate, containing 0.1% by weight of a polymerization inhibitor p-methoxyphenol; and 3 grams of benzoyl peroxide as a thermal initiator.

A photopolymerizable element was prepared utilizing the adhesive composition of this example by coating it on 2 by 6 inches aluminum sheet support 15 mils thick that had been "alodized." The process by which the aluminum sheet has been "alodized" employs proprietary compositions, and involves a five-step operation consisting of cleaning the aluminum sheets with mild alkali at approximately 80° C. for 2 to 5 minutes, rinsing in clear, cold water for 10 to 15 seconds and coating the sheet with an amorphous mixture of mixed metallic oxides and chromates from 0.005 to 0.01 mil thick, weighing 35 to 80 milligrams per square foot at approximately 20° to 40° C., in a stainless steel lined tank for 2 to 5 minutes. The coated sheet is rinsed with clear, cold water for 15 to 30 seconds, and given a final acidulated rinse with a dilute solution of the coating substance for 15 to 30 seconds at approximately 50° to 70° C.

The adhesive composition of this example was coated on the "alodized" aluminum sheet support forming an adhesive composition layer about 20 mils thick. The adhesive composition was dried for 60 minutes by exposure to air at room temperature, resulting in an adhesive layer about 3.5 mils thick on the aluminum sheet support.

A photopolymerizable layer or sheet was prepared from a filtered solution of 30 grams of N-methoxymethyl polyhexamethylene adipamide prepared as described in Example 3 of the application of Saner et al., Serial No. 638,395 filed February 5, 1957, and 30 grams of glycerol dimethacrylate in 160 milliliters of hot ethanol. Benzoin methyl ether in an amount of 0.45 gram was added to the solution. The solution was cast on a glass plate provided with a narrow dam near its periphery to prevent the solution from running over the edges of the plate and was allowed to evaporate in the dark for two days. The resulting clear, tough, flexible film 20 mils thick was cut to size of the aluminum sheet support and was laid on the adhesive covered support to form a sandwich.

The sandwich was placed in a hydraulic press, the platens of which had been preheated to 150° C., and pressed for 3 minutes at 200 p.s.i. The platens were allowed to cool and the element removed from the press. The photopolymerizable element thus prepared was exposed under an 1800-watt high-pressure mercury-arc lamp to 50 watt-second/square inch of actinic radiation so that a middle square area 2 inches by 2 inches remained unexposed. The unexposed polymer was removed by brushing for 5 minutes in 95% ethanol. The unexposed area, being unpolymerized, washed out readily, but there remained in the unexposed area a thin layer (the barrier layer) of polymerized material. The photopolymerized material in the exposed areas was unaffected by the solvent.

The resultant element thus consisted of a thick image layer at each end and a thin barrier layer of polymerized material in the middle where the unpolymerized material had been brushed away. The element was severely flexed at the junction of one of the photopolymerized image areas and the brushed out exposed area. The purpose of the severe flexing was to determine whether the base support metal could be peeled from the back of the polymerized material. Good adhesion was obtained with no lifting of the photopolymerized material from the metal base support.

EXAMPLE 2

Example 1 was repeated except that the adhesive composition coated on the aluminum support dried to a layer thickness of 3 mils.

A photopolymerizable sheet or layer was cast from a solution of 75 grams of polyvinyl alcohol (27 mole percent)/acetate (42 mole percent)/hydrogen maleate (31 mole percent), prepared by the method described in Example 4 of the application of Martin, Serial No. 604,006, filed August 14, 1956, 25 grams (25% of total solids) of 1,2-bis(3-methacrylamidopropoxy)ethane, and 0.25 gram of benzoin methyl ether in a mixture of 170 grams of ethyl alcohol in 35 milliliters of water. The solvents were evaporated at room temperature under subdued light and the resulting 20 mils thick film was cut to the base support size and laid on the adhesive covered support to form a sandwich.

The sandwich was placed in a hydraulic press, the platens of which had been preheated to 120° C., and pressed for 10 minutes at 200 p.s.i. The resulting element was exposed to actinic light as described in Example 1. The unexposed area was brushed with a 1:1 by volume ethanol-water solution for 5 minutes, during which time the unexposed area washed out except for a thin barrier layer of polymerized material covering the adhesive layer. A thick layer of photopolymerized material remained in the exposed area.

Tests conducted as in Example 1 showed excellent adhesion of the photopolymerized layer to the base support.

EXAMPLE 3

A photopolymerizable element was prepared using the adhesive coated aluminum sheet support described in Example 2.

A photopolymerizable sheet or layer was prepared from a mixture of 680 grams of cellulose acetate hydrogen succinate, 320 grams of triethylene glycol diacrylate containing 0.32 gram of anthraquinone as a photoinitiator, 0.32 gram of mucochloric acid as a stabilizing agent, and 6.5 grams of triethylamine. The mixture was placed on a rubber mill at 150° C. and milled for 30 minutes. The resulting material was removed from the rubber mill, pressed at 140° C., and the pressed photopolymerizable material cut to the size of the aluminum support and laid on the adhesive covered support to form a sandwich.

The sandwich was placed in a hydraulic press, the platens of which had been preheated to 150° C., and pressed for 3 minutes at 200 p.s.i. The resulting element was exposed to actinic light as described in Example 1, and the elements sprayed with a 0.0 N solution of sodium hydroxide for 7 minutes. The unexposed area washed out, but there remained in that area a thin barrier layer of thermally polymerized material. The exposed areas were not affected by the solvent wash.

Tests conducted as described in Example 1 showed good adhesion was obtained with no rupture of the adhesive-polymer bond, i.e., no lifting of the photopolymerized material from the base support, before the photopolymerized material fractured.

EXAMPLE 4

Example 3 was repeated except that the photopolymerizable element was exposed to a letter type process negative in a vacuum frame to give close contact between the photopolymerizable sheet and the negative. The element was washed out as described in that example and the unexposed polymer removed.

The resultant relief image printing plate was used for printing on a flat bed press. Good printing results were obtained and the adhesion of the base support to the photopolymerized material was excellent.

EXAMPLE 5

In this example there was used a 2 inches by 6 inches steel sheet support 25 mils thick which had been "bonderized," a six step operation described as follows:

(1) Clean the steel sheet with a mild alkali solution containing less than 0.1% alkali;

(2) Rinse twice in clear, cold water for a few seconds;

(3) "Bonderize" the sheet by spraying for 1 minute with a solution of free phosphoric acid, metallic acid phosphates and an oxidizing agent. The solution is maintained at a temperature of approximately 130° C.;

(4) Rinse with clear, cold water for a few seconds;

(5) Rinse with acidified water for a few seconds; and (6) Dry in an oven at over 100° C.

In the "bonderizing" process, the steel sheet product is thus coated with a mixed metallic phosphate coating weighing 13.2 milligrams per square foot. The process is described in an article by V. M. Darsey, Ind. Eng. Chem., vol. 27, pages 1142–1144 (1935).

The steel sheet support was coated with a layer 15 mils thick of an adhesive solution composed of a mixture of the copolyester described in Example 1 in methylene chloride (30% solids), 0.3 gram of triethylene glycol diacrylate and 0.033 gram of benzoyl peroxide initiator, in 5 milliliters of methylene chloride to which had been added 0.16 gram of 2,2'-dihydroxy-4,4'-dimethoxybenzophenone, an antihalation agent. The adhesive solution was dried as described in Example 1 and the resulting adhesive layer was 3 mils thick on the steel sheet support.

A photopolymerizable sheet was prepared from 60 grams of cellulose acetate to which 0.4 gram of benzoin and 40 grams of triethylene glycol diacrylate had been added. The resultant mixture was wetted with 120 milliliters of ethanol and allowed to soak in the alcohol for 3 days. The material was milled in a rubber mill for 12 minutes at 110° C. and then pressed in a laminating press, the platens of which had been preheated to 145° C. The photopolymerizable sheet material was cut to the size of the base support and was laid upon the adhesive covered support to form a sandwich.

The sandwich was placed in a hydraulic press, the platens of which had been preheated to 120° C., and pressed for 2 minutes at 300 p.s.i. The photopolymerizable element was exposed to 20 watt-seconds/square inch of actinic light as described in Example 1, and the unexposed polymer removed by brushing with acetone. The unexposed area washed out but there remained in that area a thin barrier layer of polymerized material, while a thick image layer remained in the exposed areas.

Tests as described in Example 1 evidenced good adhesion characteristics with no rupture of the adhesive-photopolymerizable material bond before the photopolymerized material fractured.

EXAMPLE 6

A treated aluminum sheet support as described in Example 1 was coated with a layer 20 mils thick of an adhesive composition solution with an inherent viscosity of 0.69 composed of 50% solids in methyl ethyl ketone, wherein the solids consisted of 15 grams of a copolyester reaction mixture of an excess of ethylene glycol and dimethyl terephthalate (33 mole percent), dimethylisophthalate (17 mole percent), and dimethyl sebacate (50 mole percent); 4.5 grams of an ethylenically unsaturated addition polymerizable compound, triethylene glycol diacrylate containing 0.1% of a polymerization inhibitor p-methoxyphenol, 0.45 gram of a thermal initiator, benzoyl peroxide, and 0.045 gram of a photoinitiator, benzoin. The adhesive solution was permitted to dry as in Example 1, resulting in an adhesive layer 3 mils thick on the aluminum sheet support.

The photopolymerizable material was prepared, cut to the base support size, laid on the adhesive covered support, pressed into a sheet, exposed, and the unpolymerized material washed out as described in Example 3. As indicated in that example, the photopolymerized material in the exposed portion did not wash away. The unexposed unpolymerized polymer washed away, revealing a thin barrier layer of polymerized material over the adhesive layer.

Tests conducted as in Example 1 showed good adhesion obtained with no rupture of the adhesive-polymer bond before the photopolymerized material fractured.

EXAMPLE 7

A treated steel sheet support as described in Example 5 was coated with a layer 20 mils thick of an adhesive solution composed of 56% solids in methylene chloride, the solids consisting of 100 grams of the copolyester described in Example 1; 30 grams of an ethylenically unsaturated polymerizable compound, ethylene glycol dimethacrylate, and 0.3 gram of a thermal initiator, benzoyl peroxide. After drying as described in Example 1, the adhesive had formed a layer 3 mils thick on the base support.

A photopolymerizable sheet was prepared as described in Example 5. The cutting, pressing, cooling, exposing, and brushing steps were identical with those of that example except that the photopolymerizable material was pressed for 2 minutes at 140° C. rather than at 120° C.

It was observed that there was a thin polymerized layer over the adhesive where the unexposed portion had been brushed away. Tests conducted as in Example 1 indicated good adhesion was obtained with no rupture of the adhesive-photopolymerizable material bond before the photopolymerized material fractured.

EXAMPLE 8

Example 7 was repeated except that the ethylenically unsaturated polymerizable compound used in the adhesive composition was a mixture of 30 grams of triethylene glycol diacrylate and 10 grams of acrylamide, and the solvent was methyl ethyl ketone (60%) solids. Tests results indicated a thin layer of polymerized material over the adhesive layer where the unexposed portion had been brushed away. Good adhesion was noted as in the preceding examples, with no rupture of the bond before the photopolymerized material fractured.

EXAMPLE 9

A treated steel sheet support as described in Example 5 was coated with a layer 20 mils thick of an adhesive solution composed of 30% solids in methyl ethyl ketone, wherein the solids consisted of 100 grams of the copolyester described in Example 1 and 0.5 gram of benzoyl peroxide as a thermal initiator. The solution was dried as indicated in Example 1 for 2 hours with an adhesive layer 3 mils thick formed on the base support. The cutting, pressing, cooling, exposing and brushing steps were identical to those of Example 5 except that the photopolymerizable material was pressed for 1.5 minutes at 150° C. Tests indicated the presence of a thin polymerized barrier layer over the adhesive layer where the unexposed portion had been brushed away. Adhesion tests as in Example 1 gave good results.

EXAMPLE 10

A treated steel sheet support as described in Example 5 was coated as indicated in Example 1 with an adhesive composition solution composed of 50% solids in methyl ethyl ketone, wherein the solids consisted of 30 grams of the copolyester described in Example 1, 9 grams of triethylene glycol diacrylate, and 0.21 gram of tert-butylhydroperoxide as a thermal initiator. The adhesive solution was dried as in that example.

A photopolymerizable sheet was prepared as described in Example 5 and laminated to the steel sheet base support in a hydraulic press, the platens of which had been preheated to 150° C., for 1.5 minutes at 200 p.s.i. The photopolymerizable layer of the resultant element was exposed to actinic light and the unexposed polymer removed by brushing with solvent as indicated in Example 5. The exposed area was unaffected by the solvent while a thin polymerized barrier layer remained in the unexposed area. Adhesion of the photopolymerized material to the base support was excellent.

EXAMPLE 11

Three adhesive compositions were prepared as in Example 1 except that the concentration of the thermal initiator varied as indicated in the following Table I. The three elements were prepared, exposed and washed out as described in Example 3. As can be seen from the table, and as pointed out above, the polymerized barrier layer thickness varies with the concentration of the thermal initiator.

*Table 1*

| Concentration of Thermal Initiator (grams) | Thermally Polymerized Barrier Layer Thickness (mils) |
|---|---|
| 0.3 | Less than 3.4. |
| 1.5 | 3.5 to 3.8. |
| 3.0 | 3.5 to 4.0. |

These three elements exhibited excellent adhesion characteristics as in the preceding examples.

EXAMPLE 12

Four photopolymerizable elements were prepared as described in Example 3 except that, prior to the heat lamination step (3 minutes at 140° C.), the elements were allowed to age for the period of time indicated in Table 2. As indicated, in that table, the thickness of the barrier layer of thermally polymerized material remaining after spray wash-out varied with the length of aging time.

*Table 2*

| Aging Time (Minutes) | Thermally Polymerized Barrier Layer Thickness (mils) |
|---|---|
| 5 | 3.0 to 3.2. |
| 120 | 3.7 to 4.8. |
| 480 | 6.3 to 7.1 |
| 10,080 | 11.0 to 12.0. |

These four elements exhibited excellent adhesion characteristics as in the preceding examples.

EXAMPLE 13

A tin plated steel sheet support, approximately 11 mils thick, which had been coated with a thin layer of a lacquer composed of a mixture of vinyl acetate and vinyl chloride copolymers and a phenolic resin, was coated with a layer, having a dry thickness of 3 mils, of an adhesive solution prepared as described in Example 1 except that the copolyester component described in that example was replaced by a polyester prepared by the reaction of ethylene glycol and dimethyl hexahydroterephthalate (100 mole percent).

A photopolymerizable sheet prepared as in Example 3 was cut to the size of the sheet support and laid upon the adhesive covered support to form a sandwich. The sandwich was pressed, exposed and the unpolymerized portion of the element removed by a spray wash of a 0.08 N aqueous solution of sodium hydroxide as in Example 3. The unexposed area washed out, but there remained in that area a thin barrier layer of thermally polymerized material. The exposed areas were not affected by the solvent wash. Tests conducted as described in Example 1 gave similar results.

EXAMPLE 14

Example 1 was repeated except that the copolyester component was replaced by a copolyester prepared by the reaction of ethylene glycol, dimethyl terephthalate (50 mole percent) and dimethyl sebacate (50 mole percent), with similarly satisfactory results.

EXAMPLE 15

Example 1 was repeated except that the copolyester component was replaced by a mixture in equal parts by weight of two copolyesters, the first prepared by the reaction of ethylene glycol, dimethyl terephthalate (33 mole percent), dimethyl isophthalate (17 mole percent) and dimethyl sebacate (50 mole percent), and the second prepared by the reaction of ethylene glycol, dimethyl terephthalate (25 mole percent), dimethyl isophthalate (25 mole percent), dimethyl sebacate (25 mole percent) and dimethyl adipate (25 mole percent), with similarly satisfactory results.

Similar results, as will be understood by persons skilled in the art, can be obtained by substituting for the materials of the above examples equivalent amounts of suitable materials, more fully described hereinafter.

It will be understood from the above that the polymeric adhesive composition can be a mixture of two or more copolyesters of the type (A)(2) first referred to above with satisfactory results. It will also be understood that the copolyester compositions can be the product of the glycol and an ester of two or more of the recited acids, as exemplified above.

Similar results can be obtained by substituting for the materials of the above examples equivalent amounts of suitable materials, more fully described hereinafter.

The preferred composition of the essential copolyester ingredient of the adhesive compositions is composed of the esterification product of ethylene glycol and dimethyl hexahydroterephthalate, dimethyl sebacate, and dimethyl terephthalate, the latter three reactants being used in a mole ratio of 8:1:1 respectively.

Suitable saturated aliphatic dicarboxylic acids represented by the formula $HOOC—(CH_2)_n—COOH$ include adipic, pimelic, suberic, azelaic, and sebacic acids.

Illustrative of glycols (having from 2 to 10 carbon atoms and 0 to 4 oxygen atoms in addition to the hydroxyl groups) suitable as a component of the essential copolyester ingredient can be mentioned the following: 1,2-ethanediol, 1,2-propanediol, 1,3-propanediol, 1,2-butanediol, 1,3-butanediol, 1,4-butanediol, 1,2-pentanediol, 2,3-pentanediol, 2,4-pentanediol, 1,5-pentanediol, 1,2-hexanediol, 2,3-hexanediol, 3,4-hexanediol, 1,6-hexanediol, 1,2-heptanediol, 1,2-octanediol, 1,2-nonanediol, 1,2-decanediol, 2-methylpropane-1,3-diol, 2,2-dimethylpropane-1,3-diol, 2,2-diethylpropane-1,3-diol, 2-methoxymethyl-2,4-dimethylpentane-1,5-diol, 2-ethylhexane-1,3-diol, diethylene glycol, triethylene glycol, dipropylene glycol, tripropylene glycol, tetraethylene glycol, pentaethylene glycol, 1,2-cyclopentanediol, 1,3-cyclopentanediol, 1,2-cyclohexanediol, 1,3-cyclohexanediol, etc.

The thermally sensitive addition polymerization initiator ingredient in the adhesive composition is one that is activatable at a temperature below 180° C. but not substantially active below about 60° C. These initiators are also characterized by being more or less activatable by actinic light. A preferred initiator is benzoyl peroxide. Illustrative of other suitable initiators can be named tert-butyl peroxide, tert-butyl hydroperoxide, cumene hydroperoxide, succinic acid peroxide, methyl ethyl ketone peroxide, lauroyl peroxide, p-chlorobenzoyl peroxide, 2,4-dichlorobenzoyl peroxide, and cyclohexanone peroxide.

A wide variety of compounds can be used as the ethylenically unsaturated addition polymerizable compound in the preferred adhesive composition according to this invention. The preferred compound is triethylene glycol diacrylate. Illustrative of other suitable compounds can be named ethylene glycol dimethacrylate, diethylene glycol diacrylate, a mixture of triethylene glycol diacrylate and acrylamide, triethylene glycol dimethacrylate, diacrylates of polyethylene glycols of molecular weights of about 300 to 500, and esters of alpha-methylene carboxylic acids, e.g., methyl methacrylate. A portion of the above described monomers can be replaced by N-(beta-hydroxyethyl)methacrylamide, N,N-bis(betahydroxyethyl(acrylamide, beta-acetoamidoethyl methacrylate and beta-methacrylamidoethyl propionate; olefin blends with ethylenic alpha,beta-dicarboxylic acid or esters thereof, e.g., styrene/diethyl fumarate, styrene/diethyl maleate; esters of vinylbenzoic acid, e.g., methyl vinyl benzoate and betahydroxyethyl vinylbenzoate.

With respect to the photopolymerizable layer of the novel photopolymerizable elements of this invention, it is preferred that the photopolymerizable composition be a mixture of cellulose acetate hydrogen succinate; triethylene glycol diacrylate; anthraquinone; and p-methoxyphenol as the inhibitor. Other photopolymerizable compositions of the type described in Plambeck U.S. Patent 2,760,863 can also be used to form solid photopolymerizable layers. Suitable additional compositions are N-methoxymethyl polyhexamethylene adipamide mixtures described in Italian Patent 568,225, October 25, 1957, and corresponding U.S. application Serial No. 577,829, filed April 12, 1956; the polyester, polyacetal or mixed polyester acetal of Martin, U.S. application Serial No. 538,277, filed October 3, 1955, now U.S. Patent 2,892,716; the polyvinyl alcohol derivative compositions of Martin U.S. application Serial No. 604,006, filed August 14, 1956, now U.S. Patent 2,902,365, and corresponding Belgian Patent 560,077 and those comprising cellulose acetate (60% by weight), triethylene glycol diacrylate (40% by weight), anthraquinone, photoinitiator (0.1% based on photopolymerizable material), and p-methoxy phenol, polymerization inhibitor (0.1% based on photopolymerizable material); polyvinyl ether and ester compositions of Martin U.S. application Serial No. 606,517, filed August 27, 1956, and corresponding Belgian Patent 560,154; water soluble cellulose ether and ester compositions of Martin U.S. application Serial No. 606,505, filed August 27, 1956; polyvinyl acetal compositions having extra linear vinylidene groups as taught by Martin U.S. application Serial No. 461,291, filed October 8, 1954, and corresponding British Patent 786,119; 1,3-butadiene compositions of McGraw U.S. application Serial No. 664,459, filed June 10, 1957; and linear polyamide compositions containing extralinear n-acrylyloxymethyl groups as taught by Saner et al. U.S. application Serial No. 638,395, filed February 5, 1957.

In the photopolymerizable layers of the elements of this invention, there can be used practically any initiator of addition polymerization that is capable of initiating polymerzation under the influence of actinic light. The preferred photoinitiators are not significantly activatable thermally at temperatures below 185° C. They should be dispersible in the photopolymerizable compositions to the extent necessary for initiating the desired polymerization under the influence of the amount of light energy absorbed in relatively short-term exposures.

A preferred class of addition polymerization initiators activatable by actinic light and thermally inactive at and below 185° C. is a substituted or unsubstituted polynuclear quinone, which is a compound having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

Suitable thermal polymerization inhibitors that can be used in addition to the preferred p-methoxyphenol include hydroquinone and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., thionine (C.I. No. 920), thionine blue G (C.I. No. 926), methylene blue B (C.I. No. 922) and toluidine blue O (C.I. No. 925).

While the base supports for the photopolymerizable elements of this invention are preferably flexible and composed of metal, e.g., aluminum or steel, they can be rigid.

Also, they can be made of various film-forming resins or polymers. Suitable supports of these types are disclosed in U.S. Patent 2,760,863, col. 5, lines 14–75, and col. 6, lines 1–15.

It will be understood that the adhesive compositions can be used in photopolymerizable elements in other positions than adjacent the base support, as long as the adhesive layer is adjacent and underneath the photopolymerizable layer to permit the formation of the polymerized barrier layer in the lowermost portion of the photopolymerizable layer, and thus bar the harmful attack of solvents during wet processing of the element.

The antihalation material mentioned above can be in the support, or in a layer of stratum on the surface of the support, or contained in the anchor layer, or contained in the photopolymerizable layer. The antihalation material should be sufficiently absorptive of actinic light so as to permit reflectance from the support or combined support of no more than 35% of incident actinic light. Suitable materials are disclosed in the patents and applications referred to above.

The adhesive composition is preferably applied to the support as a solvent solution. Suitable solvents, in addition to the preferred methyl ethyl ketone, include: methylene chloride, chloroform, methyl isopropyl ketone and methyl isobutyl ketone.

The adhesive composition can also be applied as a sheet in the absence of a solvent, or it can be laid down with a doctor knife, or if in a solvent solution, by spraying the metal support. The adhesive composition can also be applied to the light-sensitive photopolymerizable layer, rather than to the sheet support, prior to sandwiching the element together.

The photopolymerizable structures of the present invention are particularly well suited for the production of printing reliefs after the manner disclosed in Plambeck U.S. Patent 2,760,863. They also are useful for affixing phosphor to surfaces to provide color television screens and for forming printed circuit diagrams. The printing reliefs can be used in all classes of printing but are most applicable to those classes of printing wherein a distinct difference in height between printing and non-printing areas is required.

In addition to the advantages of improved adhesion mentioned above, the photopolymerizable element of this invention provides a more serviceable article, in that it has improved support for relief images due to the thin polymerized barrier layer forming a continuous support for the relief image. The novel element is also advantageous because the adhesive retains its elasticity over a wide temperature range.

What is claimed is:

1. A polymerizable element comprising (I) a support; (II) a solid photopolymerizable layer comprising an organic polymeric binder, an ethylenically unsaturated monomer capable of forming a high polymer by photoinitiated photopolymerization, and an addition polymerization initiator activatable by actinic light and thermally inactive at 185° C. and below; and (III), between (I) and (II) and in surface contact with (II), an anchor layer of an adhesive composition comprising (A) at least 66.5 parts by weight of a linear polymeric composition selected from the group consisting of: (1) a polyester prepared by reacting (*a*) a compound taken from the group consisting of hexahydroterephthalic acid and an ester-forming derivative of hexahydroterephthalic acid and (*b*) a glycol having from 2 to 10 carbon atoms and 0 to 4 oxygen atoms in addition to the hydroxyl groups; (2) at least one copolyester prepared by reacting (*a*) at least one saturated aliphatic compound taken from the group consisting of adipic, pimelic, suberic, azelaic and sebacic acids and an ester-forming derivative of said acids, the total of the said compounds being in an amount of 50 mole percent of said copolyester, (*b*) at least one aromatic compound taken from the group consisting of terephthalic acid, isophthalic acid and an ester-forming derivative of said acids, the total of the said compounds being in an amount of 50 mole percent of said copolyester and (*c*) a glycol having from 2 to 10 carbon atoms and 0 to 4 oxygen atoms in addition to the hydroxyl groups; and (3) a copolyester prepared by reacting (*a*) a compound taken from the group consisting of hexahydroterephthalic acid and an ester-forming derivative of said acid in an amount up to 100 mole percent of the copolyester, (*b*) a saturated aliphatic compound taken from the group consisting of adipic, pimelic, suberic, azelaic and sebacic acids and an ester-forming derivative of said acids, in an amount up to 50 mole percent of the copolyester, (*c*) an aromatic compound taken from the group consisting of terephthalic, isophthalic acids and an ester-forming derivative of said acids, in an amount up to 50 mole percent of the copolyester, and (*d*) a glycol having from 2 to 10 carbon atoms and 0 to 4 oxygen atoms in addition to the hydroxyl groups; and (B) from 0.5 to 10 parts by weight of a thermally sensitive addition polymerization initiator thermally active below 180° C. and substantially thermally inactive at about 60° C. and below.

2. A photopolymerizable element as set forth in claim 1 wherein said adhesive composition additionally contains up to 33 parts by weight of an ethylenically unsaturated addition polymerizable compound, said polymerizable compound containing a thermal polymerization inhibitor.

3. A polymerizable element comprising (I) a support; (II) a solid photopolymerizable layer comprising an organic polymeric binder, an ethylenically unsaturated monomer capable of forming a high polymer by photoinitiated photopolymerization, and an addition polymerization initiator activatable by actinic light and thermally inactive at 185° C. and below; and (III), between (I) and (II) and in surface contact with (II), an anchor layer of an adhesive composition comprising (A) at least 66.5 parts by weight of a linear copolyester prepared by reacting (*a*) a compound taken from the group consisting of hexahydroterephthalic acid and an ester-forming derivative of said acid, in an amount of 20 to 80 mole percent, (*b*) a saturated aliphatic compound taken from the group consisting of adipic, pimelic, suberic, azelaic and sebacic acids and an ester-forming derivative of said acids, in an amount of 40 to 10 mole percent, (*c*) an aromatic compound taken from the group consisting of terephthalic acid, isophthalic acid and an ester-forming derivative of said acids, in an amount of 40 to 10 mole percent, and (*d*) a glycol having from 2 to 10 carbon atoms and 0 to 4 oxygen atoms in addition to the hydroxyl groups; and (B) from 0.5 to 10 parts by weight of a thermally sensitive addition polymerization initiator thermally active below 180° C. and substantially thermally inactive at about 60° C. and below.

4. A polymerizable element as set forth in claim 3 wherein said hexahydroterephthalic acid, said aliphatic acid and said aromatic acid respectively are in a molar ratio of about 8:1:1.

5. A polymerizable element as set forth in claim 3 wherein said adhesive composition additionally contains up to 33 parts by weight of an ethylenically unsaturated polymerizable compound, said polymerizable compound containing a thermal polymerization inhibitor.

6. A polymerizable element as set forth in claim 3 wherein said organic polymeric binder is cellulose acetate succinate, said unsaturated compound in said photopolymerizable layer is from the group consisting of acrylic and alpha-alkacrylic acid esters of polyethylene glycols, and said initiator in said photopolymerizable layer is anthraquinone.

7. A polymerizable element comprising (I) a support; (II) a solid photopolymerizable layer comprising a cellulose carboxylic acid ester, an ethylenically unsaturated monomer capable of forming a high polymer by photoinitiated photopolymerization, and an addition polymerization initiator activatable by actinic light and thermally inactive at 180° C. and below; and (III), between (I) and (II) and in surface contact with (II), an anchor layer of an adhesive composition comprising (1) about 75 parts by weight of the copolyester prepared by reacting an excess of ethylene glycol and dimethyl hexahydroterephthalate, dimethyl sebacate and dimethyl terephthalate, the latter three reactants in a molar ratio of 8:1:1 respectively, (2) about 2.4 parts by weight of benzoyl peroxide as a thermally sensitive initiator, and (3) about 22.5 parts by weight of triethylene glycol diacrylate containing about 0.1 part by weight of p-methoxyphenol as a thermal polymerization inhibitor.

8. A polymerizable element as set forth in claim 3 wherein said organic polymeric binder is N-methoxymethyl polyhexamethylene adipamide.

9. A polymerizable element as set forth in claim 3 wherein said organic polymeric binder is a polyvinyl alcohol/acetate/hydrogen maleate.

References Cited in the file of this patent

UNITED STATES PATENTS

| | | |
|---|---|---|
| 2,437,046 | Rothrock et al. | Mar. 2, 1948 |
| 2,760,863 | Plambeck | Aug. 28, 1956 |
| 2,791,504 | Plambeck | May 7, 1957 |